United States Patent
Lin et al.

(10) Patent No.: US 11,489,328 B2
(45) Date of Patent: Nov. 1, 2022

(54) METHOD FOR PROTECTING A SERVER FROM DAMAGE BY A LIQUID LEAK FROM A LIQUID-COOLING UNIT

(71) Applicant: MITAC COMPUTING TECHNOLOGY CORPORATION, Taoyuan (TW)

(72) Inventors: Hsiu-Sheng Lin, Hsinchu (TW); Ho-Tien Chang, Hsinchu (TW)

(73) Assignee: Mitac Computing Technology Corporation, Taoyuan (TW)

(*) Notice: Subject to any disclaimer, the term of this patent is extended or adjusted under 35 U.S.C. 154(b) by 105 days.

(21) Appl. No.: 17/224,253

(22) Filed: Apr. 7, 2021

(65) Prior Publication Data

US 2021/0320490 A1 Oct. 14, 2021

(30) Foreign Application Priority Data

Apr. 8, 2020 (TW) ................. 109111790

(51) Int. Cl.
| | |
|---|---|
| *H02H 5/08* | (2006.01) |
| *H05K 7/20* | (2006.01) |
| *H02H 1/00* | (2006.01) |
| *G01M 3/00* | (2006.01) |

(52) U.S. Cl.
CPC .......... *H02H 5/083* (2013.01); *H02H 1/0092* (2013.01); *H02H 5/086* (2013.01); *H05K 7/20763* (2013.01); *G01M 3/00* (2013.01)

(58) Field of Classification Search
CPC ...... H02H 5/083; H02H 5/086; H02H 1/0092; H05K 7/20763
See application file for complete search history.

(56) References Cited

U.S. PATENT DOCUMENTS

| | | | |
|---|---|---|---|
| 2010/0057263 A1* | 3/2010 | Tutunoglu | F25B 49/027 700/282 |
| 2016/0270267 A1* | 9/2016 | Chainer | H05K 7/20781 |
| 2017/0181329 A1* | 6/2017 | Shelnutt | H05K 7/20781 |
| 2017/0318706 A1* | 11/2017 | Franz | H05K 1/147 |
| 2020/0378858 A1* | 12/2020 | Curtis | F17D 5/06 |

\* cited by examiner

*Primary Examiner* — Scott Bauer
(74) *Attorney, Agent, or Firm* — Michael Best & Friedrich LLP

(57) ABSTRACT

A method for protecting a server from damage by a liquid leak from a liquid-cooling unit of the server is provided. The server further includes a liquid leak sensor unit, a programmable logic circuit, and a power supply unit that supplies main power and standby power for the server. When a liquid leak is detected, the liquid leak sensor unit generates a main-power-off signal to the programmable logic circuit that causes the power supply unit to stop outputting the main power accordingly. The liquid leak sensor unit sends a total-power-off signal to the power supply unit to stop supply of the standby power after the power supply unit has stopped outputting the main power.

20 Claims, 5 Drawing Sheets

METHOD FOR PROTECTING A SERVER FROM DAMAGE BY A LIQUID LEAK FROM A LIQUID-COOLING UNIT

FIELD

The disclosure relates to a method for protecting a server, and more particularly to a method for protecting a server from damage by a liquid leak from a liquid-cooling unit.

BACKGROUND

When a computer is in operation, internal components may generate a lot of heat. If the heat is not dissipated effectively, performance of the computer will be degraded, and in serious cases, electronic components may be damaged or their service life may be significantly reduced.

As computer performance and heat flux density of electronic components continue to increase, fan cooling alone is no longer sufficient to remove the heat generated by the computer because of the poor heat conduction properties of the air. Therefore, water-cooled cooling technology is gradually replacing traditional fan cooling technology for having good heat exchange efficiency.

However, in an enclosed chassis, liquid leakage from a liquid-cooling device is not easily detected. Since the liquid cooling head is in direct contact with the heat source (i.e., the electronic components), the electronic components inside the chassis may be damaged if the electronic components is working when the liquid leakage occurs.

SUMMARY

Therefore, an object of the disclosure is to provide a method that can alleviate at least one of the drawbacks of the prior art.

According to the disclosure, a method for protecting a server that includes a liquid-cooling unit from damage by a liquid leak from the liquid-cooling unit is provided. The server further includes a liquid leak sensor unit to detect a liquid leak from the liquid-cooling unit, a power supply unit electrically coupled to the liquid leak sensor unit, and a programmable logic circuit electrically coupled to the liquid leak sensor unit and the power supply unit. The power supply unit supplies electric power that includes main power and standby power for the server. The method includes: A) by the liquid leak sensor unit, generating and sending a main-power-off signal to the programmable logic circuit upon detecting that a liquid leak from the liquid-cooling unit has occurred; B) by the programmable logic circuit, causing the power supply unit to stop outputting the main power upon receipt of the main-power-off signal; C) upon detecting that the liquid leak from the liquid-cooling unit has occurred, by the liquid leak sensor unit, generating and sending a total-power-off signal to the power supply unit a predetermined length of time after generation of the total-power-off signal, wherein the predetermined length of time is so configured that the power supply unit receives the total-power-off signal after the power supply unit has stopped outputting the main power; and D) by the power supply unit, stopping output of the electric power upon receipt of the total-power-off signal so that the standby power is not outputted.

According to this disclosure, another method for protecting a server that includes a liquid-cooling unit from damage by a liquid leak event is provided. The server includes a power distribution board (PDB) and a plurality of baseboards electrically coupled to the power distribution board. Each of the baseboards includes a baseboard liquid-cooling unit, a baseboard liquid leak sensor unit to detect a liquid leak from the baseboard liquid-cooling unit, a baseboard management controller (BMC) unit electrically coupled to the baseboard liquid leak sensor unit, and a programmable logic circuit electrically coupled to the BMC unit. The power distribution board is configured to supply electric power, which includes main power and standby power, to each of the baseboards. The method includes, when a liquid leak from the liquid-cooling unit of one of the baseboards, which is referred to as an event-related baseboard, has occurred: A) by an event-related baseboard liquid leak sensor unit, which is the baseboard liquid leak sensor unit of the event-related baseboard, generating and sending, upon detecting that a liquid leak from the liquid-cooling unit of the event-related baseboard has occurred, a baseboard leak notification that is related to the event-related baseboard to an event-related BMC unit, which is the BMC unit of the event-related baseboard; B) by the event-related BMC unit, generating and sending, based on the baseboard leak notification, a baseboard-leak main-power-off signal to an event-related programmable logic circuit, which is the programmable logic circuit of the event-related baseboard; C) by the event-related programmable logic circuit, stopping supply of the main power to the event-related baseboard upon receipt of the baseboard-leak main-power-off signal; D) by the event-related BMC unit, sending the baseboard leak notification to the power distribution board; E) by the power distribution board, sending the baseboard leak notification to each of the baseboard(s) other than the event-related baseboard; and F) by the power distribution board, stopping output of the electric power to the event-related baseboard a first predetermined length of time after receipt of the baseboard leak notification, so that the standby power is not supplied to the event-related baseboard. The first predetermined length of time is so configured that the power distribution board stops output of the electric power after the event-related programmable logic circuit has stopped supply of the main power to the event-related baseboard.

According to this disclosure, yet another method for protecting a server that includes a liquid-cooling unit from damage by a liquid leak event is provided. The server includes a power distribution board (PDB) and a plurality of baseboards electrically coupled to the power distribution board. The power distribution board includes a PDB liquid-cooling unit, a PDB liquid leak sensor unit to detect a liquid leak from the PDB liquid-cooling unit, and a microcontroller unit electrically coupled to the PDB liquid leak sensor unit. Each of the baseboards includes a baseboard management controller (BMC) unit and a programmable logic circuit electrically coupled to the BMC unit. The power distribution board is configured to supply electric power, which includes main power and standby power, to each of the baseboards. The method includes: A) by the PDB liquid leak sensor unit, generating and sending a PDB leak notification to the microcontroller unit upon detecting that a liquid leak from the PDB liquid-cooling unit has occurred; B) by the microcontroller unit, generating and sending a PDB-leak main-power-off signal to the BMC units of the baseboards upon receipt of the PDB leak notification; C) by the BMC unit of each of the baseboards, sending the PDB-leak main-power-off signal to the programmable logic circuit of the baseboard upon receipt of the PDB-leak main-power-off signal; and D) by the programmable logic circuit of each of the baseboards, stopping supply of the main power to the baseboard upon receipt of the PDB-leak main-power-off signal.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
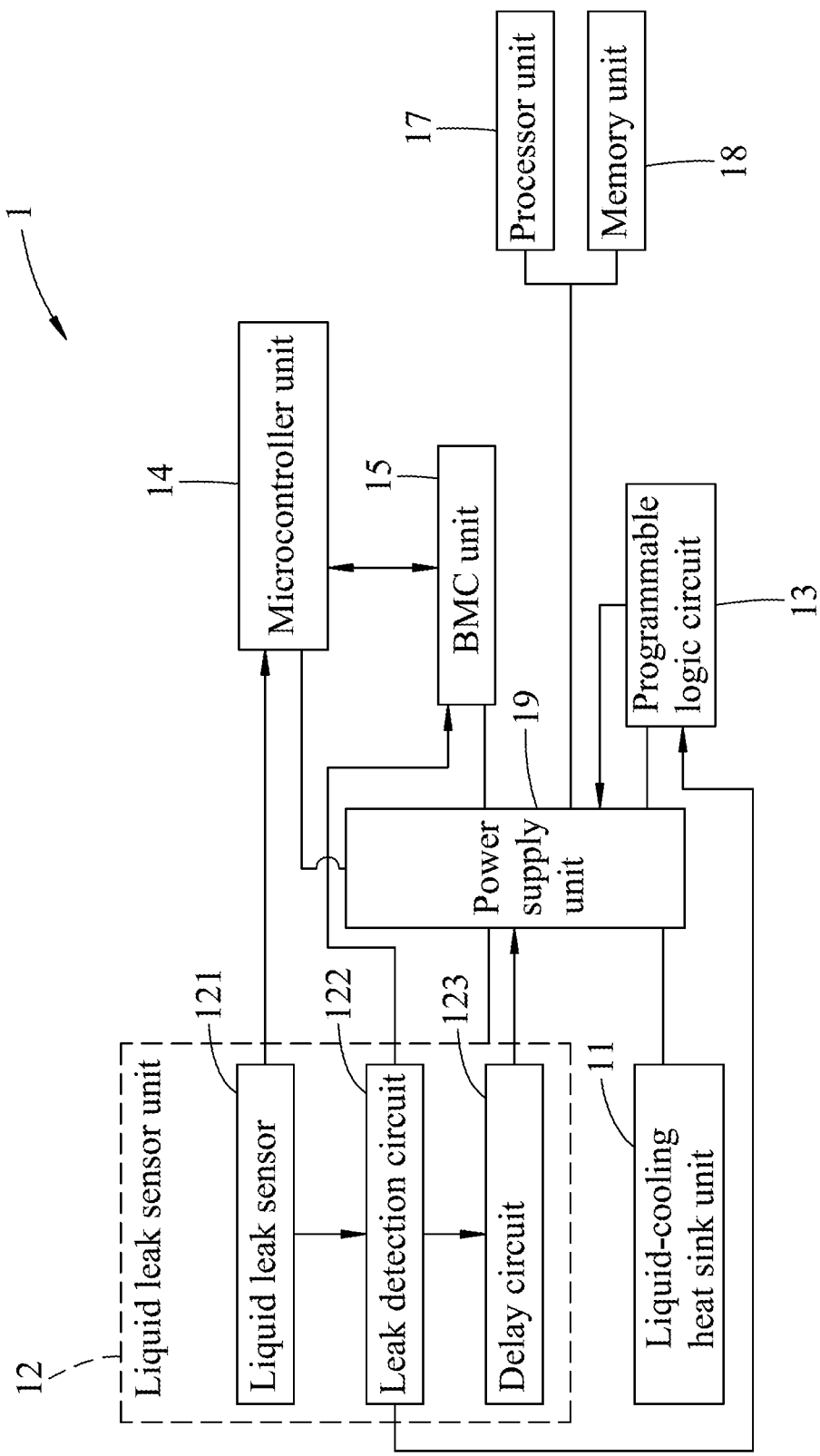
FIG. 1 is a block diagram exemplarily illustrating a server to implement a first embodiment of a method for protecting the server from damage by a liquid leak from a liquid-cooling unit according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

FIG. 1 exemplarily illustrates a server 1 that implements a first embodiment of a method for protecting the server 1 from damage by a liquid leak from a liquid-cooling unit according to this disclosure. The server 1 includes a liquid-cooling unit 11, a liquid leak sensor unit 12, a programmable logic circuit 13, a microcontroller unit 14, a baseboard management controller (BMC) unit 15, a processor 17, a memory unit 18 and a power supply unit 19. In this embodiment, the processor 17 is exemplified as a central processing unit (CPU) of the server 1, and the memory unit 18 is exemplified as a dual in-line memory module (DIMM), but this disclosure is not limited to such.

The liquid leak sensor unit 12 is configured to detect a liquid leak from the liquid-cooling unit 12, and includes a liquid leak sensor 121, a leak detection circuit 122 electrically coupled to the liquid leak sensor 121, and a delay circuit 123 electrically coupled to the leak detection circuit 122 and the power supply unit 19. The liquid leak sensor 121 is configured to generate a leak signal for receipt by the leak detection circuit 122 upon detecting that a liquid leak from the liquid-cooling unit 12 has occurred. In other embodiments, the liquid leak sensor unit 12 may include multiple liquid leak sensors, and this disclosure is not limited in this respect.

The programmable logic circuit 13 is electrically coupled to the leak detection circuit 122 and the power supply unit 19. In this embodiment, the programmable logic circuit 13 may be implemented using a field programmable gate array (FPGA) or a complex programmable logic device (CPLD), but this disclosure is not limited in this respect.

The microcontroller unit 14 is electrically coupled to the liquid leak sensor 121 of the liquid leak sensor unit 12 for receiving the leak signal, and is implemented using a micro control unit (MCU), but this disclosure is not limited in this respect.

The BMC unit 15 is electrically coupled to the microcontroller unit 14 for communication therewith, is electrically coupled to the leak detection circuit 122 of the liquid leak sensor unit 12 for receiving signals therefrom, and is configured to monitor a state of a computer (e.g., a fan speed, a system temperature, liquid leak, etc.) managed thereby via sensors, and to record the state of the computer.

The power supply unit 19 is electrically coupled to the liquid-cooling unit 11, the liquid leak sensor unit 12, the programmable logic circuit 13, the microcontroller unit 14, the BMC unit 15, the processor unit 17 and the memory unit 18, and is configured to supply electric power to the same. The electric power includes main power that is supplied to the processor unit 17 and the memory unit 18, standby power that is supplied to the liquid leak sensor unit 12, the programmable logic circuit 13, the microcontroller unit 14 and the BMC unit 15, and auxiliary power that is supplied to the liquid-cooling unit 11.

Figure 2:
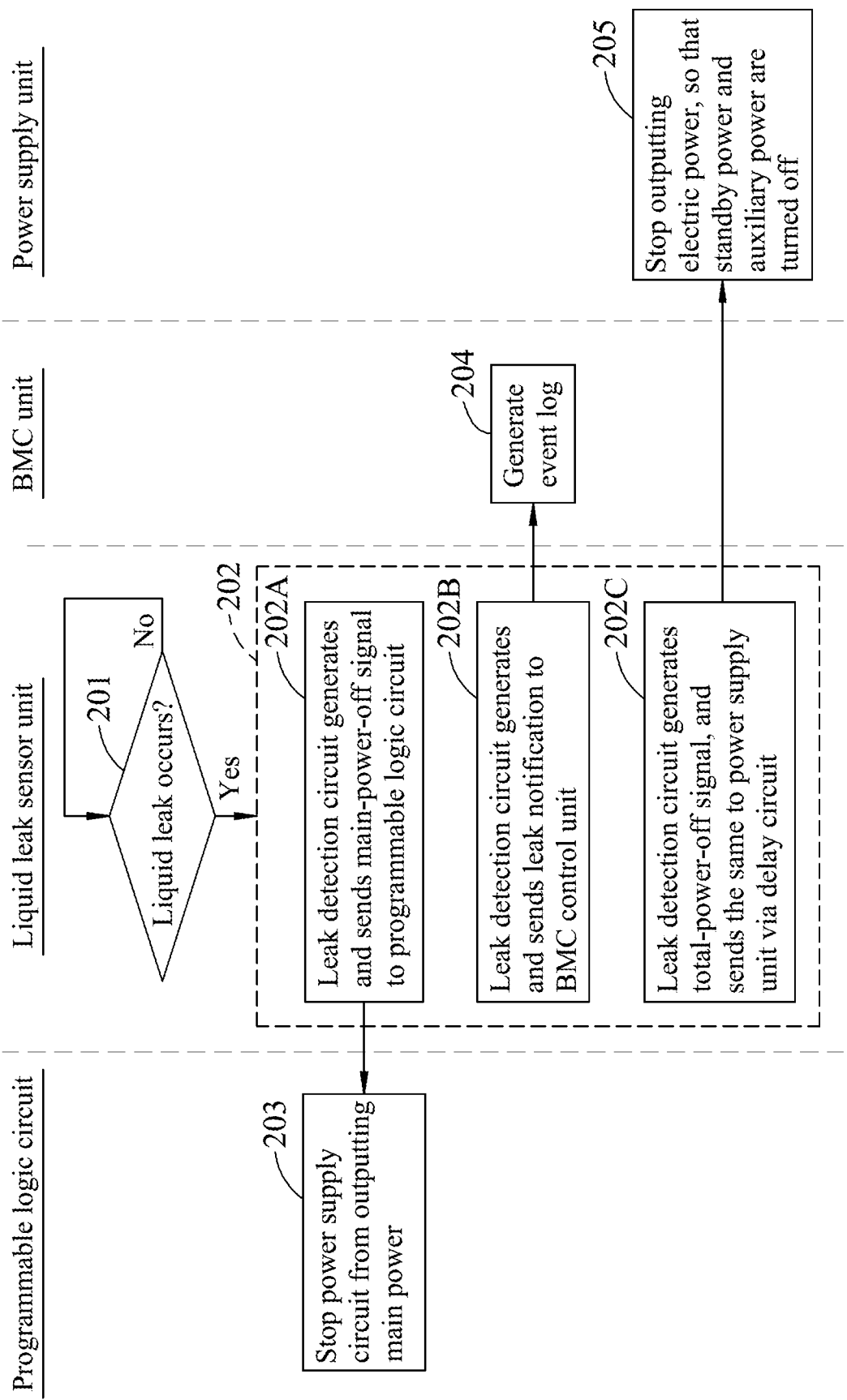
FIG. 2 is a flow chart illustrating the first embodiment.

FIG. 2 illustrates steps of the first embodiment. The following description will make reference to FIG. 1 and FIG. 2.

In step 201, the leak detection circuit 122 determines whether the liquid leak sensor 121 detects that a liquid leak from the liquid-cooling unit 11 has occurred. The flow goes to step 202 when the determination is affirmative, and step 201 is repeated when otherwise.

Step 202 that follows step 201 includes sub-steps 202A, 202B and 202C. In sub-step 202A, the leak detection circuit 122 generates and sends a main-power-off signal to the programmable logic circuit 13. In sub-step 202B, the leak detection circuit 122 generates and sends a leak notification (e.g., indicating that a liquid leak has occurred) to the BMC unit 15. In sub-step 202C, the leak detection circuit 122 generates and sends a total-power-off signal to the power supply unit 19 via the delay circuit 123 that delays output of the total-power-off signal to the power supply unit 19 by a predetermined length of time after receipt of the total-power-off signal (which is considered simultaneous with generation of the total-power-off signal herein, i.e., a time difference between generation of the total-power-off signal by the leak detection circuit 122 and receipt of the total-power-off signal by the delay circuit 123 is negligible herein). In other words, in a case that sub-steps 202A, 202B and 202C are performed at the same time, the power supply unit 19 will receive the total-power-off signal the predetermined length of time after the programmable logic circuit 13 receives the main-power-off signal.

In step 203 that follows sub-step 202A, the programmable logic circuit 13 causes the power supply unit 19 to stop outputting the main power upon receipt of the main-power-off signal.

In step 204 that follows sub-step 202B, the BMC unit 15 generates an event log to record the liquid leak based on the leak notification.

In step 205 that follows sub-step 202C, the power supply unit 19 stops outputting the electric power upon receipt of the total-power-off signal from the delay circuit 123, so that the standby power and the auxiliary power are turned off. It is noted that step 205 is later than steps 203 and 204 by the predetermined length of time, and during the interval between execution of step 205 and execution of steps 203 and 204, the standby power is still supplied while the main power has already been turned off. The predetermined length of time is so configured as to allow the power supply unit 19 to stop outputting the main power (thereby making the power supply unit 19 receive the total-power-off signal after the power supply unit 19 has stopped outputting the main power), and is long enough so that the BMC unit 15 can generate the event log using the standby power and the server 1 can turn off all the software programs and shut down all the hardware components using the standby power during the predetermined length of time. In other words, the predetermined length of time is configured such that step 205 is performed after steps 203 and 204. In this embodiment, the predetermined length of time exemplarily ranges between 400 ms and 600 ms to fulfill the abovementioned requirement, but this disclosure is not limited in this respect.

Figure 3:
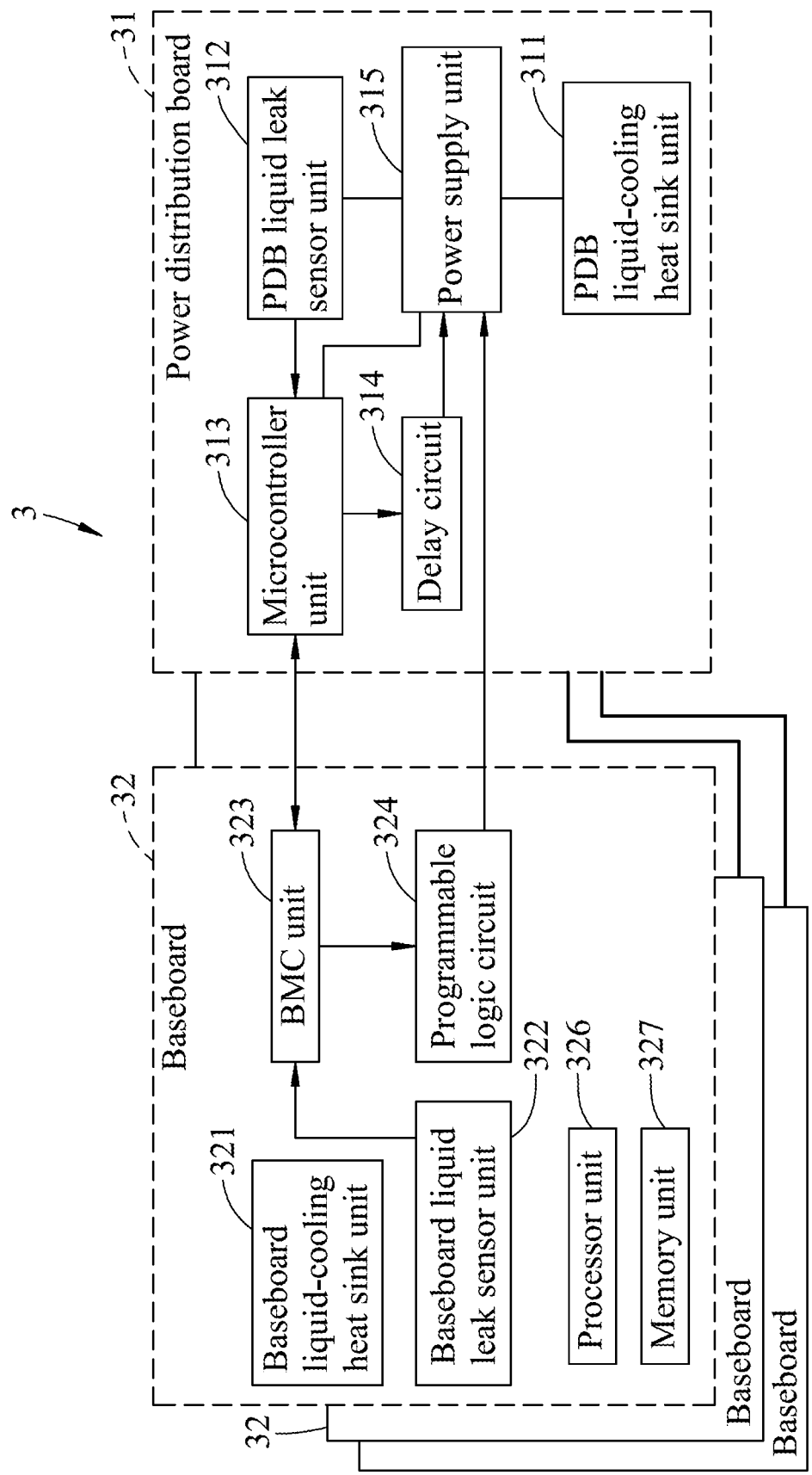
FIG. 3 is a block diagram exemplarily illustrating a server to implement a second embodiment of a method for protecting the server from damage by a liquid leak from a liquid-cooling unit according to the disclosure.

FIG. 3 exemplarily illustrates a server 3 that implements a second embodiment of a method for protecting the server 3 from damage by a liquid leak from a liquid-cooling unit (liquid leak event) according to this disclosure. The server 3 includes a power distribution board (PDB) 31, and a plurality of baseboards 32 electrically coupled to the power distribution board 31.

The power distribution board 31 is configured to supply electric power, which includes main power, standby power and auxiliary power, to the baseboards 32, and includes a PDB liquid-cooling unit 311, a PDB liquid leak sensor unit 312 to detect a liquid leak from the PDB liquid-cooling unit 311, a microcontroller unit 313 electrically coupled to the PDB liquid leak sensor unit 312, a delay circuit 314 electrically coupled to the microcontroller unit 313, and a power supply unit 315 electrically coupled to the delay circuit 314. The PDB liquid leak sensor unit 312 may include a liquid leak sensor and a liquid detection circuit, similarly to those used in the liquid leak sensor unit 12 (see FIG. 1) of the first embodiment.

The power supply unit 315 is configured to supply the electric power to the baseboards 32. The power supply unit 315 is also electrically coupled to the PDB liquid-cooling unit 311, the PDB liquid leak sensor unit 32 and the microcontroller unit 313 for supplying electric power thereto. The electric power to be supplied to the power distribution board 31 includes main power that is supplied to electronic components on the power distribution board 31, standby power that is supplied to the PDB liquid leak sensor unit 312 and the microcontroller unit 313, and auxiliary power that is supplied to the PDB liquid-cooling unit 311.

Each of the baseboards 32 includes a baseboard liquid-cooling unit 321, a baseboard liquid leak sensor unit 322 to detect a liquid leak from the baseboard liquid-cooling unit 321, a BMC unit 323 electrically coupled to the baseboard liquid leak sensor unit 322, a programmable logic circuit 324 electrically coupled to the BMC unit 323 and the power supply unit 315, a processor unit 326, and a memory unit 327. The electric power supplied to each of the baseboards 32 includes main power that is supplied to the processor unit 326 and the memory unit 327, standby power that is supplied to the baseboard liquid leak sensor unit 322, the programmable logic circuit 324 and the BMC unit 323, and auxiliary power that is supplied to the baseboard liquid-cooling unit 321. The baseboard liquid leak sensor unit 312 may include a liquid leak sensor and a liquid detection circuit, similarly to those used in the liquid leak sensor unit 12 (see FIG. 1) of the first embodiment. The BMC unit 323 of each of the baseboard 32 is communicatively coupled to other baseboards 32 for transmission of information therebetween.

The second embodiment includes a first procedure to handle a condition that a liquid leak has occurred on one of the baseboards 32, and a second procedure to handle a condition that a liquid leak has occurred on the power distribution board 31.

Figure 4:
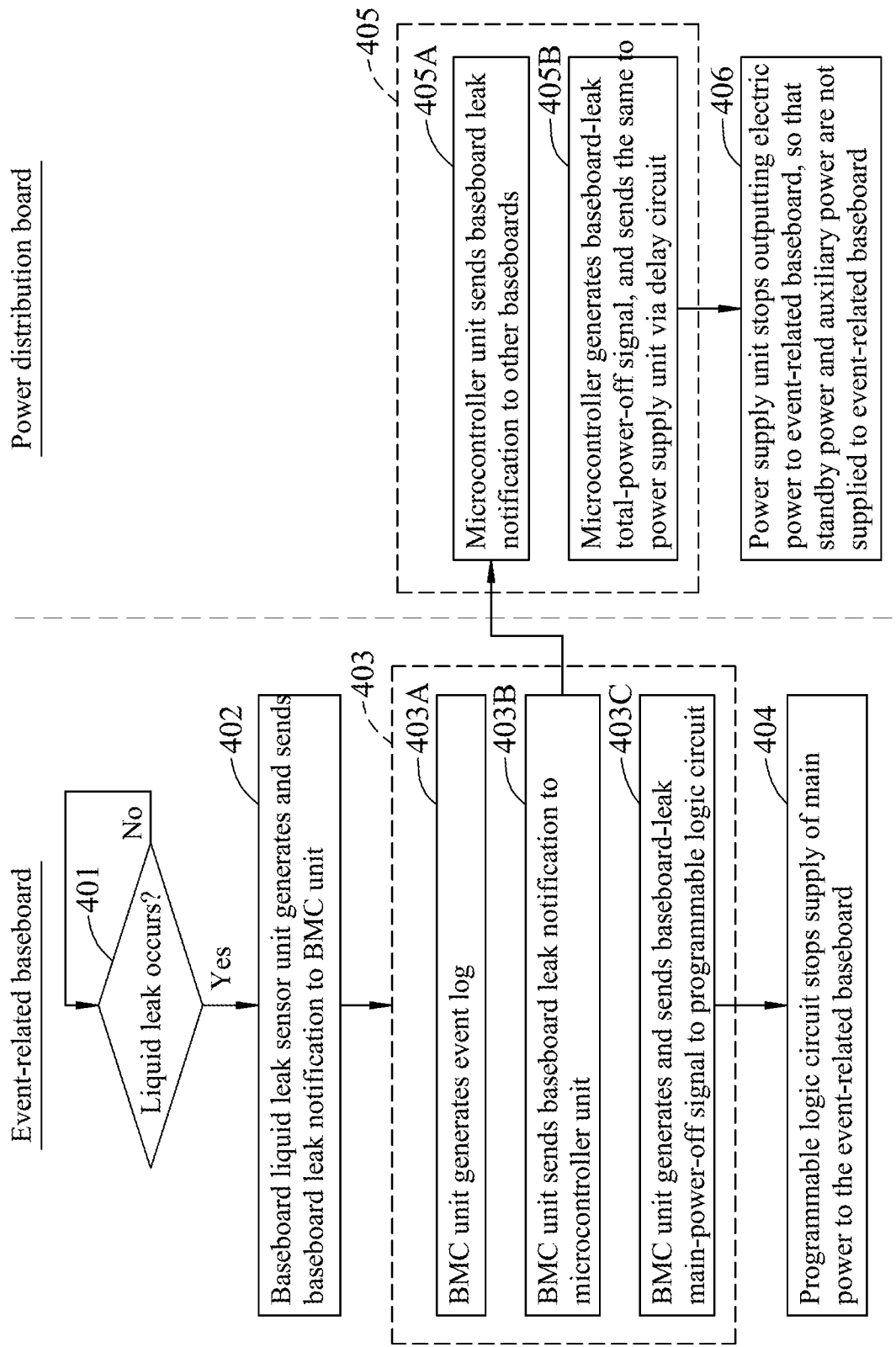
FIG. 4 is a flow chart illustrating a first procedure of the second embodiment.

FIG. 4 illustrates steps of the first procedure of the second embodiment, description for which will also make reference to FIG. 3.

In step 401, the baseboard liquid leak sensor unit 323 (referred to as an event-related baseboard liquid leak sensor unit 323 hereinafter) of one of the baseboards 32 (referred to as an event-related baseboard 32 hereinafter) determines whether a liquid leak from the baseboard liquid-cooling unit 321 of the event-related baseboard 32 has occurred. The flow goes to step 402 when the determination is affirmative, and step 401 is repeated when otherwise.

In step 402, the event-related baseboard liquid leak sensor unit 322 generates and sends a baseboard leak notification that is related to the event-related baseboard 32 (e.g., indicating that a liquid leak has occurred on the event-related baseboard 32) to the BMC unit 323 of the event-related baseboard 32 (referred to as an event-related BMC unit 323 hereinafter).

Step 403 that follows step 402 includes sub-steps 403A, 403B and 403C. In sub-step 403A, the event-related BMC unit 323 generates an event log that records the liquid leak of the baseboard liquid-cooling unit 321 of the event-related baseboard 32 based on the baseboard leak notification. In sub-step 403B, the event-related BMC unit 323 sends the baseboard leak notification to the microcontroller unit 313. In sub-step 403C, the event-related BMC unit 323 generates and sends a baseboard-leak main-power-off signal to the programmable logic circuit 324 of the event-related baseboard 32 (referred to as an event-related programmable logic circuit 324) based on the baseboard leak notification.

In step 404 that follows sub-step 403C, the event-related programmable logic circuit 324 stops supply of the main power to the event-related baseboard 32 upon receipt of the baseboard-leak main-power-off signal. In one implementation, the event-related programmable logic circuit 324 sends a signal to the power supply unit 315 to cause the power supply unit 315 to stop outputting the main power to the event-related baseboard 32. In one implementation, the event-related programmable logic circuit 324 disables a voltage regulator circuit (not shown) of the event-related baseboard 32 to block provision of the main power to the processor unit 326 and the memory unit 327 of the event-related baseboard 32.

Step 405 that follows sub-step 403B includes sub-steps 405A and 405B. In sub-step 405A, the microcontroller unit 313 sends the baseboard leak notification to each of the baseboards 32 other than the event-related baseboard 32. In detail, the baseboard leak notification is sent to the BMC unit 323 of each of the baseboards 32 other than the event-related baseboard 32, and then the BMC unit 323 stops communication with the event-related baseboard 32 upon receipt of the baseboard leak notification. In sub-step 405B, the microcontroller unit 313 generates a baseboard-leak total-power-off signal that corresponds to the event-related baseboard 32 to the power supply unit 315 via the delay circuit 314 that delays output of the baseboard-leak total-power-off signal to the power supply unit 315 by a first predetermined length of time.

In step 406 that follows sub-step 405B, the power supply unit 315 stops outputting the electric power to the event-related baseboard 32 upon receipt of the baseboard-leak total-power-off signal from the delay circuit 314. As a result, the power supply unit 315 stops outputting the electric power to the event-related baseboard 12 the first predetermined length of time after receipt of the baseboard leak notification, so that the standby power and the auxiliary power are not supplied to the event-related baseboard 32.

In this embodiment, the first predetermined length of time is configured to be long enough so that the event-related programmable logic circuit 324 can stop supply of the main power to the event-related baseboard 32, and so that the event-related BMC unit 323 can generate the event log. Therefore, the first predetermined length of time is configured such that step 406 is performed after steps 402, 403 and 404. In this embodiment, the first predetermined length of time exemplarily ranges between 400 ms and 600 ms to fulfill the abovementioned requirement, but this disclosure is not limited in this respect.

Figure 5:
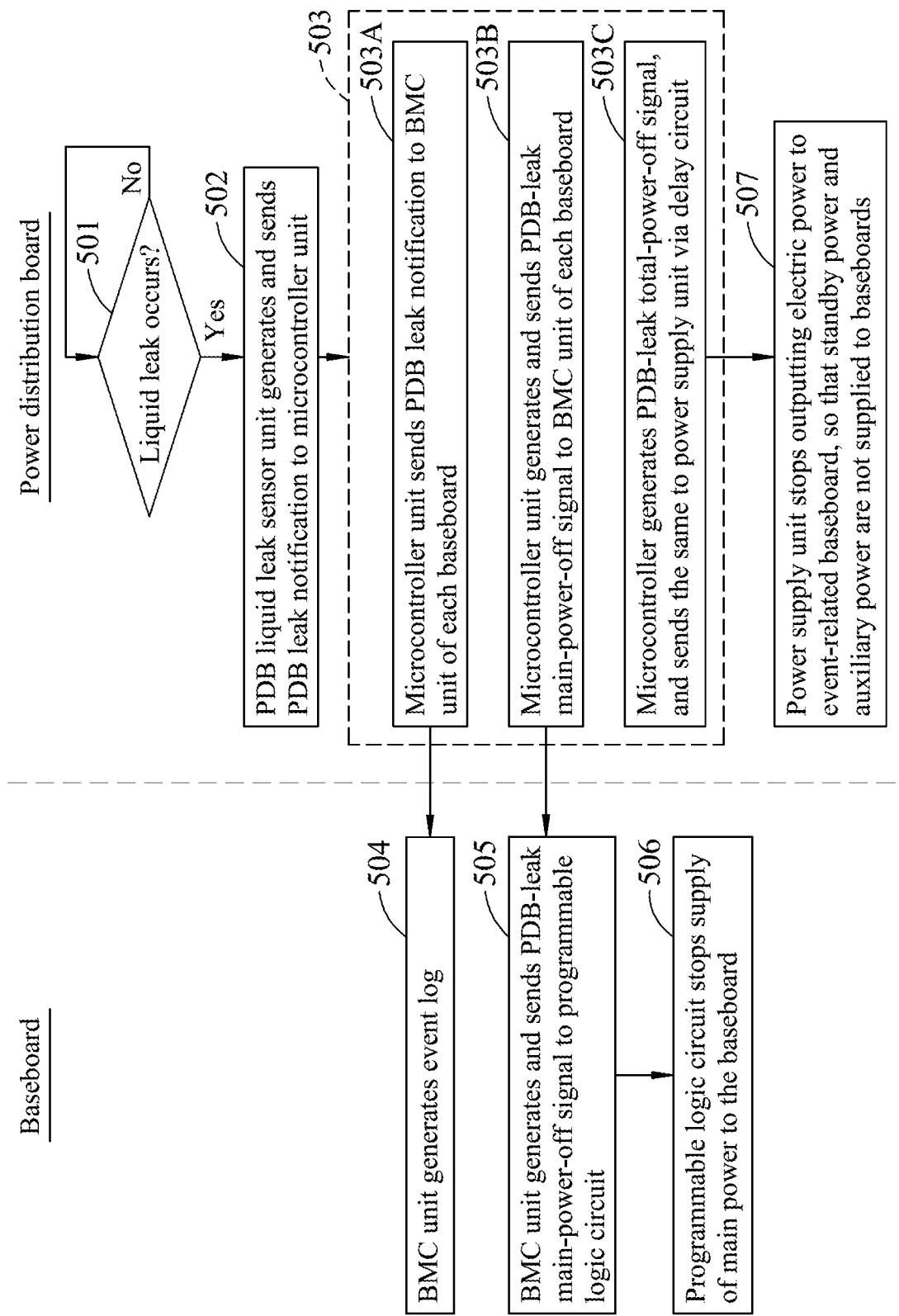
FIG. 5 is a flow chart illustrating a second procedure of the second embodiment.

FIG. 5 illustrates steps of the second procedure of the second embodiment. The second procedure will be explained in detail with reference to both FIG. 5 and FIG. 3.

In step 501, the PDB liquid leak sensor unit 312 determines whether a liquid leak from the PDB liquid-cooling unit 311 has occurred. The flow goes to step 502 when the determination is affirmative, and step 501 is repeated when otherwise.

In step 502, the PDB liquid leak sensor unit 322 generates and sends a PDB leak notification (e.g., indicating that a liquid leak has occurred on the power distribution board 31) to the microcontroller unit 313.

Step 503 that follows step 502 includes sub-steps 503A, 503B and 503C. In sub-step 503A, the microcontroller unit 313 sends the PDB leak notification to the BMC units 323 of the baseboards 32. In sub-step 503B, the microcontroller unit 313 generates and sends a PDB-leak main-power-off signal to the BMC units 323 of the baseboards 32 upon receipt of the PDB leak notification. In sub-step 503C, the microcontroller 313 generates and sends a PDB-leak total-power-off signal to the power supply unit 315 a second predetermined length of time after receipt of the PDB leak notification. To be specific, the microcontroller 313 sends the PDB-leak total-power-off signal to the power supply unit 315 via the delay circuit 314 that delays output of the PDB-leak total-power-off signal to the power supply unit 315 by the second predetermined length of time. It is noted that the delay circuit 314 may include a first delay circuitry (not shown) for delaying output of the baseboard-leak total-power-off signal, and a second delay circuitry (not shown) for delaying output of the PDB-leak total-power-off signal. It is noted that the second predetermined length of time may either be the same as or different from the first predetermined length of time, but this disclosure is not limited in this respect.

In step 504 that follows sub-step 503A, the BMC units 323 of the baseboards 32 each generate an event log that records the liquid leak of the PDB liquid-cooling unit 311 based on the PDB leak notification.

In step 505 that follows sub-step 503B, the BMC unit 323 of each of the baseboards 32 sends the PDB-leak main-power-off signal to the programmable logic circuit 324 of the baseboard 32 upon receipt of the PDB-leak main-power-off signal from the microcontroller unit 313.

In step 506 that follows step 505, the programmable logic circuit 324 of each of the baseboards 32 stops supply of the main power to the baseboard 32 upon receipt of the PDB-leak main-power-off signal. In one implementation, the programmable logic circuit 324 of each of the baseboards 32 sends a signal to the power supply unit 315 to cause the power supply unit 315 to stop outputting the main power to the baseboard 32. In one implementation, the programmable logic circuit 324 of each of the baseboards 32 disables a voltage regulator circuit (not shown) of the baseboard 32 to block provision of the main power to the processor unit 326 and the memory unit 327 of the baseboard 32.

In step 507 that follows sub-step 503C, the power supply unit 315 stops outputting the electric power to each of the baseboards 32 upon receipt of the PDB-leak total-power-off signal from the delay circuit 314, so that the standby power and the auxiliary power are not supplied to each of the baseboards 32.

In this embodiment, the second predetermined length of time is configured to be long enough so that the programmable logic circuits 324 can stop supply of the main power to the baseboards 32, and so that the BMC units 323 can each generate the event log. Therefore, the second predetermined length of time is configured such that step 507 is performed after steps 504 and 506. In this embodiment, the second predetermined length of time exemplarily ranges between 400 ms and 600 ms to fulfill the abovementioned requirement, but this disclosure is not limited in this respect.

In this embodiment, when a liquid leak occurring on one of the baseboards 32 (i.e., the event-related baseboard 32) is detected, the first procedure is performed so that the power distribution board 31 only stops provision of electric power to the event-related baseboard 32 while the other baseboards 32 continue to operate normally; and when a liquid leak occurring on the power distribution board 31 is detected, the second procedure is performed so that the power distribution board 31 first stops provision of the main power to the baseboards 32 to make the baseboards 32 stop operating, and then stops provision of the electric power to the baseboards 32 to make the server 3 stop operating. It is noted that the first procedure and the second procedure of the second embodiment are not necessarily implemented together by the server 3. In some embodiments, the server 3 may implement only one of the first and second procedures of the second embodiment, and this disclosure is not limited in this respect.

In summary, this disclosure provides two embodiments of the method for protecting a server from damage by a liquid leak from a liquid-cooling unit. In the first embodiment, when a liquid leak is detected, the programmable logic circuit 13 makes the power supply unit 19 stop outputting the main power, and the BMC unit 15 generates the event log to record an operation condition at that moment; and then the power supply unit 19 stops outputting the electric power to prevent electronic components of the server 1 from damage. In the first procedure of the second embodiment, when a liquid leak on one of the baseboards 32 (i.e., the event-related baseboard 32) is detected, the event-related BMC unit 323 generates the event log to record an operation condition at that moment, and the event-related programmable logic circuit 324 stops supply of the main power to the event-related baseboard 32; and then the power distribution board 31 stops outputting the electric power to the event-related baseboard 32 to prevent electronic components of the event-related baseboard 32 from damage. In the second procedure of the second embodiment, when a liquid leak on the power distribution board 31 is detected, each of the baseboards 32 generates the event log to record an operation condition at that moment, and the programmable logic circuit 324 of each of the baseboards 32 stops supply of the main power to the baseboard 32; and then the power distribution board 31 stops outputting the electric power to each of the baseboards 32 to prevent electronic components of the server 3 from damage.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method for protecting a server that includes a liquid-cooling unit from damage by a liquid leak from the liquid-cooling unit, the server further including a liquid leak sensor unit to detect a liquid leak from the liquid-cooling unit, a power supply unit electrically coupled to the liquid leak sensor unit, and a programmable logic circuit electrically coupled to the liquid leak sensor unit and the power supply unit, the power supply unit supplying electric power that includes main power and standby power for the server, said method comprising:
   A) by the liquid leak sensor unit, generating and sending a main-power-off signal to the programmable logic circuit upon detecting that a liquid leak from the liquid-cooling unit has occurred;
   B) by the programmable logic circuit, causing the power supply unit to stop outputting the main power upon receipt of the main-power-off signal;
   C) upon detecting that the liquid leak from the liquid-cooling unit has occurred, by the liquid leak sensor unit, generating and sending a total-power-off signal to the power supply unit a predetermined length of time after generation of the total-power-off signal, wherein the predetermined length of time is so configured that the power supply unit receives the total-power-off signal after the power supply unit has stopped outputting the main power; and
   D) by the power supply unit, stopping output of the electric power upon receipt of the total-power-off signal so that the standby power is not outputted.

2. The method of claim 1, the server further including a baseboard management controller (BMC) unit electrically coupled to the liquid leak sensor unit, the method further comprising:
   E) by the liquid leak sensor unit, upon detecting that a liquid leak from the liquid-cooling unit has occurred, generating and sending a leak notification to the BMC unit; and
   F) by the BMC unit, generating an event log to record the liquid leak based on the leak notification.

3. The method of claim 1, the liquid leak sensor unit including a liquid leak sensor, a leak detection circuit electrically coupled to the liquid leak sensor, and a delay circuit electrically coupled to the leak detection circuit and the power supply unit;
   wherein step A) includes, by the leak detection circuit, generating and sending the main-power-off signal to the programmable logic circuit when the liquid leak sensor detects that a liquid leak from the liquid-cooling unit has occurred; and
   wherein step C) includes, by the leak detection circuit and when the liquid leak sensor detects that a liquid leak from the liquid-cooling unit has occurred, generating and sending the total-power-off signal to the power supply unit via the delay circuit that delays output of the total-power-off signal to the power supply unit by the predetermined length of time.

4. A method for protecting a server from damage by a liquid leak event, the server including a power distribution board (PDB) and a plurality of baseboards electrically coupled to the power distribution board, each of the baseboards including a baseboard liquid-cooling unit, a baseboard liquid leak sensor unit to detect a liquid leak from the baseboard liquid-cooling unit, a baseboard management controller (BMC) unit electrically coupled to the baseboard liquid leak sensor unit, and a programmable logic circuit electrically coupled to the BMC unit, the power distribution board configured to supply electric power to each of the baseboards, the electric power including main power and standby power, said method comprising, when a liquid leak from the liquid-cooling unit of one of the baseboards, which is referred to as an event-related baseboard, has occurred:
   A) by an event-related baseboard liquid leak sensor unit, which is the baseboard liquid leak sensor unit of the event-related baseboard, generating and sending, upon detecting that a liquid leak from the liquid-cooling unit of the event-related baseboard has occurred, a baseboard leak notification that is related to the event-related baseboard to an event-related BMC unit, which is the BMC unit of the event-related baseboard;
   B) by the event-related BMC unit, generating and sending, based on the baseboard leak notification, a baseboard-leak main-power-off signal to an event-related programmable logic circuit, which is the programmable logic circuit of the event-related baseboard;
   C) by the event-related programmable logic circuit, stopping the main power from being supplied to the event-related baseboard upon receipt of the baseboard-leak main-power-off signal;
   D) by the event-related BMC unit, sending the baseboard leak notification to the power distribution board;
   E) by the power distribution board, sending the baseboard leak notification to each of the baseboard(s) other than the event-related baseboard; and
   F) by the power distribution board, stopping output of the electric power to the event-related baseboard a first predetermined length of time after receipt of the baseboard leak notification, so that the standby power is not supplied to the event-related baseboard, wherein the first predetermined length of time is so configured that the power distribution board stops output of the electric power to the event-related baseboard after the event-related programmable logic circuit has stopped supply of the main power to the event-related baseboard.

5. The method of claim 4, further comprising, after step A): by the event-related BMC unit, generating an event log that records the liquid leak of the baseboard liquid-cooling unit of the event-related baseboard based on the baseboard leak notification.

6. The method of claim 4, the power distribution board including a microcontroller unit, a delay circuit that is electrically coupled to the microcontroller unit, and a power supply unit that is electrically coupled to the delay circuit and that is configured to generate the electric power to be supplied to each of the baseboards;
   wherein step D) includes, by the event-related BMC unit, sending the baseboard leak notification to the microcontroller unit;

wherein step E) includes, by the microcontroller unit, sending the baseboard leak notification to each of the baseboard(s) other than the event-related baseboard; and wherein step F) includes:
by the microcontroller unit, generating and sending a baseboard-leak total-power-off signal corresponding to the event-related baseboard to the power supply unit via the delay circuit that delays output of the baseboard-leak total-power-off signal to the power supply unit by the first predetermined length of time; and by the power supply unit, stopping output of the electric power to the event-related baseboard upon receipt of the baseboard-leak total-power-off signal so that the standby power is not supplied to the event-related baseboard.

7. The method of claim 4, the power distribution board including a PDB liquid-cooling unit, a PDB liquid leak sensor unit to detect a liquid leak from the PDB liquid-cooling unit, and a microcontroller unit electrically coupled to the PDB liquid leak sensor unit, the method further comprising:
G) by the PDB liquid leak sensor unit, generating and sending a PDB leak notification to the microcontroller unit upon detecting that a liquid leak from the PDB liquid-cooling unit has occurred;
H) by the microcontroller unit, sending the PDB leak notification to the BMC units of the baseboards; and
I) by the BMC unit of each of the baseboards, generating an event log that records the liquid leak of the PDB liquid-cooling unit based on the PDB leak notification.

8. The method of claim 7, further comprising, after step G):
J) by the microcontroller unit, generating and sending a PDB-leak main-power-off signal to the BMC units of the baseboards upon receipt of the PDB leak notification;
K) by the BMC unit of each of the baseboards, sending the PDB-leak main-power-off signal to the programmable logic circuit of the baseboard upon receipt of the PDB-leak main-power-off signal; and
L) by the programmable logic circuit of each of the baseboards, stopping supply of the main power to the baseboard upon receipt of the PDB-leak main-power-off signal.

9. The method of claim 8, the power distribution board further including a power supply unit that is electrically coupled to the microcontroller unit and that is configured to generate the electric power to be supplied to each of the baseboards, said method further comprising, after step G):
J) by the microcontroller unit, generating and sending a PDB-leak total-power-off signal to the power supply unit such that the power supply unit receives the PDB-leak total-power-off signal a second predetermined length of time after the microcontroller receives the PDB leak notification, wherein the second predetermined length of time is so configured that the power supply unit receives the PDB-leak total-power-off signal after the programmable logic circuit of each of the baseboards has stopped supply of the main power to the baseboard; and
K) by the power supply unit, stopping output of the electric power to each of the baseboards upon receipt of the PDB-leak total-power-off signal, so that the standby power is not supplied to each of the baseboards.

10. The method of claim 9, the power distribution board further including a delay circuit electrically coupled to the microcontroller unit and the power supply unit, wherein step J) further includes, by the microprocessor unit, generating and providing the PDB-leak total-power-off signal to the power supply unit via the delay circuit that delays output of the PDB-leak total-power-off signal to the power supply unit by the second predetermined length of time.

11. The method of claim 8, the programmable logic circuit of each of the baseboards being electrically coupled to the power distribution board, wherein step L) includes, by the programmable logic circuit of each of the baseboards, causing the power distribution board to stop outputting the main power to the baseboard upon receipt of the PDB-leak main-power-off signal.

12. The method of claim 4, further comprising, after step E): by the BMC unit of each of the baseboards other than the event-related baseboard, stopping communication with the event-related baseboard upon receipt of the baseboard leak notification.

13. The method of claim 4, the programmable logic circuit of each of the baseboards being electrically coupled to the power distribution board, wherein step C) includes: by the event-related programmable logic circuit, causing the power distribution board to stop outputting the main power to the event-related baseboard upon receipt of the baseboard-leak main-power-off signal.

14. A method for protecting a server from damage by a liquid leak event, the server including a power distribution board (PDB) and a plurality of baseboards electrically coupled to the power distribution board, the power distribution board including a PDB liquid-cooling unit, a PDB liquid leak sensor unit to detect a liquid leak from the PDB liquid-cooling unit, and a microcontroller unit electrically coupled to the PDB liquid leak sensor unit, each of the baseboards including a baseboard management controller (BMC) unit and a programmable logic circuit electrically coupled to the BMC unit, the power distribution board configured to supply electric power to each of the baseboards, the electric power including main power and standby power, said method comprising:
A) by the PDB liquid leak sensor unit, generating and sending a PDB leak notification to the microcontroller unit upon detecting that a liquid leak from the PDB liquid-cooling unit has occurred;
B) by the microcontroller unit, generating and sending a PDB-leak main-power-off signal to the BMC units of the baseboards upon receipt of the PDB leak notification;
C) by the BMC unit of each of the baseboards, sending the PDB-leak main-power-off signal to the programmable logic circuit of the baseboard upon receipt of the PDB-leak main-power-off signal; and
D) by the programmable logic circuit of each of the baseboards, stopping supply of the main power to the baseboard upon receipt of the PDB-leak main-power-off signal.

15. The method of claim 14, the power distribution board further including a power supply unit that is electrically coupled to the microcontroller unit and that is configured to generate the electric power to be supplied to each of the baseboards, said method further comprising, after step A):
E) by the microcontroller unit, generating and sending a PDB-leak total-power-off signal to the power supply unit a first predetermined length of time after receipt of the PDB leak notification, wherein the first predetermined length of time is so configured that the power supply unit receives the PDB-leak total-power-off signal after the programmable logic circuit of each of the baseboards has stopped supply of the main power to the baseboard; and F) by the power supply unit, stopping output of the electric power to each of the baseboards upon receipt of the PDB-leak total-power-off signal, so that the standby power is not supplied to each of the baseboards.

16. The method of claim 15, the power distribution board further including a delay circuit electrically coupled to the microcontroller unit and the power supply unit, wherein step J) further includes, by the microprocessor unit, generating and providing the PDB-leak total-power-off signal to the power supply unit via the delay circuit that delays output of the PDB-leak total-power-off signal to the power supply unit by the first predetermined length of time.

17. The method of claim 14, the programmable logic circuit of each of the baseboards being electrically coupled to the power distribution board, wherein step D) includes, by the programmable logic circuit of each of the baseboards, causing the power distribution board to stop outputting the main power to the baseboard upon receipt of the PDB-leak main-power-off signal.

18. The method of claim 14, further comprising, after step A):

by the microcontroller unit, sending the PDB leak notification to the BMC units of the baseboards; and by the BMC unit of each of the baseboards, generating an event log that records the liquid leak of the PDB liquid-cooling unit based on the PDB leak notification.

19. The method of claim 14, each of the baseboards further including a baseboard liquid-cooling unit and a baseboard liquid leak sensor unit that is electrically coupled to the BMC unit of the baseboard and that is configured to detect a liquid leak from the baseboard liquid-cooling unit, said method further comprising, when a liquid leak from the liquid-cooling unit of one of the baseboards, which is referred to as an event-related baseboard, has occurred:

E) by an event-related baseboard liquid leak sensor unit, which is the baseboard liquid leak sensor unit of the event-related baseboard, generating and sending, upon detecting that a liquid leak of the liquid-cooling unit of the event-related baseboard has occurred, a baseboard leak notification that is related to the event-related baseboard to an event-related BMC unit, which is the BMC unit of the event-related baseboard;

F) by the event-related BMC unit, generating and sending, based on the baseboard leak notification, a baseboard-leak main-power-off signal to an event-related programmable logic circuit, which is the programmable logic circuit of the event-related baseboard;

G) by the event-related programmable logic circuit, stopping supply of the main power to the event-related baseboard upon receipt of the baseboard-leak main-power-off signal;

H) by the event-related BMC unit, sending the baseboard leak notification to the power distribution board;

I) by the power distribution board, sending the baseboard leak notification to each of the baseboard(s) other than the event-related baseboard; and J) by the power distribution board, stopping output of the electric power to the event-related baseboard a second predetermined length of time after receipt of the baseboard leak notification, so that the standby power is not supplied to the event-related baseboard, wherein the second predetermined length of time is so configured the power distribution board stops output of the electric power to the event-related baseboard after the event-related programmable logic circuit has stopped supply of the main power to the event-related baseboard.

20. The method of claim 19, the power distribution board further including a delay circuit electrically coupled to the microcontroller unit and a power supply unit electrically coupled to the delay circuit;

wherein step H) includes, by the event-related BMC unit, sending the baseboard leak notification to the microcontroller unit;

wherein step I) includes, by the microcontroller unit, sending the baseboard leak notification to each of the baseboard(s) other than the event-related baseboard; and wherein step J) includes:

by the microcontroller unit, generating and sending a baseboard-leak total-power-off signal corresponding to the event-related baseboard to the power supply unit via the delay circuit that delays output of the baseboard-leak total-power-off signal to the power supply unit by the second predetermined length of time; and by the power supply unit, stopping output of the electric power to the event-related baseboard upon receipt of the baseboard-leak total-power-off signal so that the standby power is not supplied to the event-related baseboard.

* * * * *